United States Patent [19]

Haji

[11] Patent Number: 4,644,187

[45] Date of Patent: Feb. 17, 1987

[54] GATE ARRAY BASIC CELL

[75] Inventor: Yasutaka Haji, Kawasaki, Japan

[73] Assignee: Kabushiki Kaisha Toshiba, Kawasaki, Japan

[21] Appl. No.: 681,634

[22] Filed: Dec. 14, 1984

[30] Foreign Application Priority Data

Dec. 17, 1983 [JP] Japan ................... 58-238656

[51] Int. Cl.⁴ .................... H01L 27/10; H01L 27/12
[52] U.S. Cl. .................... 307/303; 307/468; 364/491; 357/45; 357/41
[58] Field of Search ............... 307/303, 445, 465, 468, 307/469, 451; 364/489, 490, 491; 357/45, 41

[56] References Cited

U.S. PATENT DOCUMENTS 4,513,307  4/1985  Brown .................... 357/42

FOREIGN PATENT DOCUMENTS 45948   9/1980  Japan .
44592  10/1980  Japan .
181028 10/1984  Japan .
80251   5/1985  Japan .

Primary Examiner—Stanley D. Miller
Assistant Examiner—Richard Roseen
Attorney, Agent, or Firm—Finnegan, Henderson, Farabow, Garrett & Dunner

[57] ABSTRACT

There is disclosed a semiconductor integrated circuit device in which the gate of a MOSFET of one circuit of the P channel MOSFET is connected to the gate of a MOSFET of the other circuit of the P channel MOSFET, and the gate of a MOSFET of one circuit of the N channel MOSFET is connected to the gate of a MOSFET of the other circuit of the N channel MOSFET.

3 Claims, 15 Drawing Figures

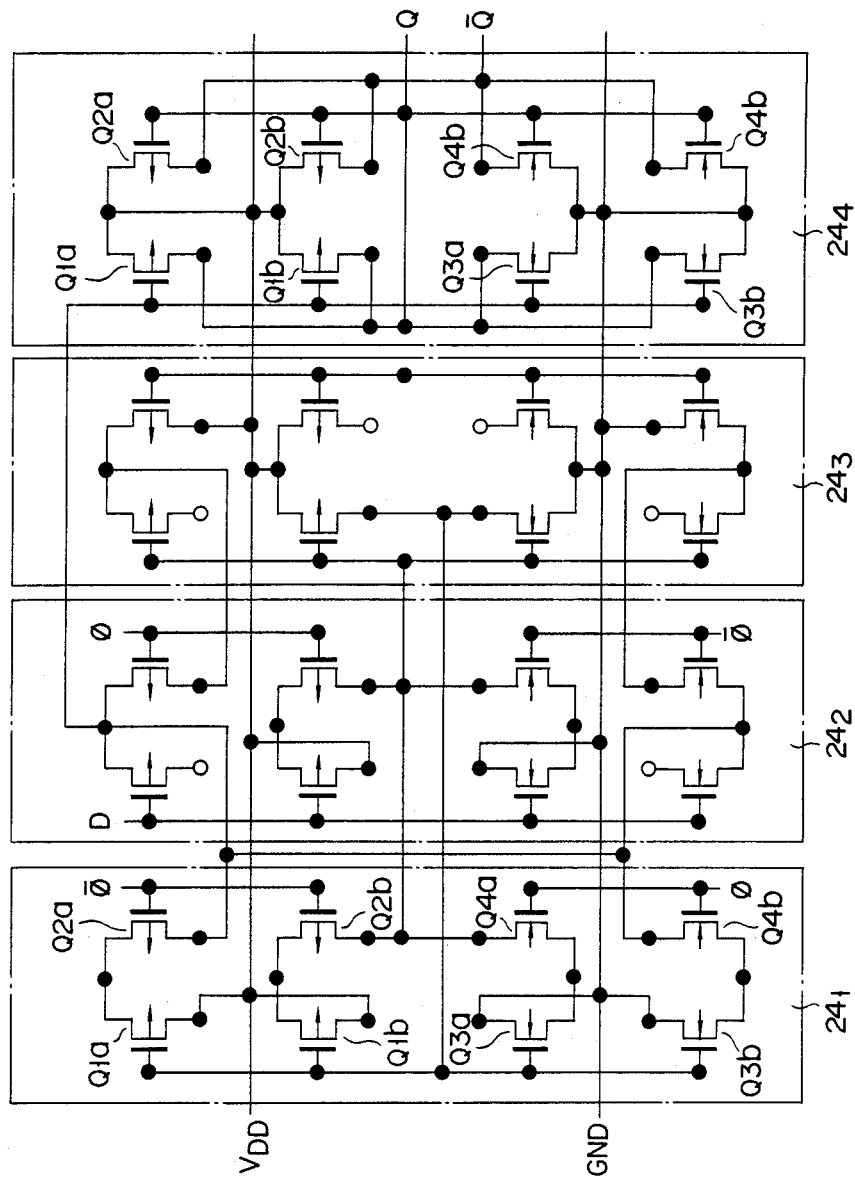
F I G. 14

GATE ARRAY BASIC CELL

BACKGROUND OF THE INVENTION

The present invention relates to a semiconductor integrated circuit device to which a master slice system having a plurality of basic cells is applied and, more particularly, to a structure of the basic cell.

In this type of the conventional semiconductor integrated circuit device, the basic cells are arrayed in a predetermined pattern. Each of the basic cells is made up of COMSFETs and has a circuit arrangement as shown in FIGS. 1 and 2. The master slice system means a logic circuit forming technique in which, for a desired logic circuit formation, an interconnection pattern is selectively applied to a basic function logic circuit (referred to as a micro cell) consisting of small groups of basic cells arranged in a matrix fashion on a substrate. This will be explained in more detail.

In FIGS. 1 and 2, Q1 and Q2 designate respectively P channel MOSFETs. MOSFETs Q1 and Q2 are structurally arranged in opposition on a semiconductor wafer 1, and electrically connected in series with open gate electrodes. MOSFETs Q3 and Q4 are of N channel and structurally arranged in opposition on the wafer 1. These transistors are also connected in series, while being electrically open at the gate electrode. The transistors Q1–Q4 form a basic cell. A plurality of the basic cells, thus structured, are arrayed in a matrix fashion on the wafer 1. MOSFETs are selectively connected among the basic cells to form a desired logic circuit.

Another conventional basic cell is schematically and structurally illustrated in FIGS. 3 and 4. A group of P channel MOSFETs Q5–Q7 connected in series and another group of N channel MOSFETs Q8–Q10 are arranged in opposition on a semiconductor wafer 2. The gate electrodes MOSFETs Q5 and Q8, Q6 and Q9, and Q7 and Q10 are interconnected with each other, as shown. As in the FIG. 1 case, the basic cells are arranged in a matrix fashion. These MOSFETs are selectively interconnected among the basic cells, thereby to form a logic circuit.

FIG. 5 shows an exclusive OR gate as an example of the micro cell, which is constructed by using the basic cells shown in FIGS. 3 and 4. The exclusive OR gate is expressed by a symbol shown in FIG. 6. The exclusive OR gate is also expressed by a combination of logic gates, two NOR gates 12 and 13, and an AND gate 4, as shown in FIG. 7. In FIGS. 5–7, A and B designate input signals, and Z designates an output signal. $V_{DD}$ designates a power potential, and GND designates a ground potential. In the gate circuit of FIG. 5, $11_1$ and $11_2$ stand for basic cells. As shown, P channel MOSFETs Q11–Q13 in the basic cell $11_1$ are connected in series with P channel basic cells Q21–Q23. Similarly, N channel MOSFETs Q14–Q16 in the basic cell $11_1$ are connected in series with N channel MOSFETs Q24–Q26 in the basic cell $11_2$. The groups of the transistors Q11–Q13 and Q21–Q23 are oppositely arranged with each other on a semiconductor wafer, and the groups of N channel MOSFETs Q14–Q16 and Q24–Q26 are likewise oppositely arranged. The MOSFETs Q11–Q16 and Q21–Q26 are selectively interconnected. In the model pattern of FIG. 5, circles indicate contact portions necessary for forming a semiconductor device as a product, while black dots indicate contact portions necessary for forming the circuit of FIG. 7.

In the conventional semiconductor device to which the master slice system is applied, MOSFETs constituting each basic cell are designed with the equal dimensions. The size of the MOSFETs is standardized. The standardization enables a designer to flexibly design various types of logic circuits in a computer aided design (CAD). The number of loads and gate circuits, which result from the interconnection wires, is different with the type of logic circuit. Allowing this, the size of the MOSFET is satisfactorily large so as to be adaptable for a logic circuit requiring a large drive ability. In other words, the MOSFET is designed to have a satisfactorily large mutual conductance "gm". However, the size of this is usually much larger than that of the least required. Thus, in the conventional semiconductor devices, the size of the MOSFET used is relatively large. This indicates that the packing density is low.

Further, when MOSFETs with many different "gm rates" are required for the N channel and the P channel MOSFETs, various MOSFETs must be used. This is undesirable from the viewpoint of circuit design and applications of the circuit elements.

SUMMARY OF THE INVENTION

Accordingly, an object of the present invention is to provide a semiconductor integrated circuit device of the master slice system applicable type, which has a high packing density and has a mutual conductance rate of COMSFETs as may appropriately be set.

According to the invention, there is provided a semiconductor integrated circuit device comprising a plurality of basic cells arranged in a predetermined pattern, each of the basic cells comprising first, second, third and fourth MOSFET series paths, wherein each of the first and second MOSFET series paths comprises a plurality of MOSFETs of a first channel type connected in series;

each of the third and fourth MOSFET series paths comprises a plurality of MOSFETs of a second channel type connected in series;

the gate of each of the MOSFETs of the first MOSFET series path is connected to the gate of a corresponding one of the MOSFETs of the second MOSFET series path; and the gate of each of the MOSFETs of the third MOSFET series path is connected to the gate of a corresponding one of the MOSFETs of the fourth MOSFET series path.

BRIEF DESCRIPTION OF THE DRAWINGS

FIG. 14 shows a circuit diagram of the static shift register shown in FIG. 13, which is constructed using the basic cells as shown in FIGS. 8 and 9.

DETAILED DESCRIPTION OF THE PREFERRED EMBODIMENTS

Figure 8:
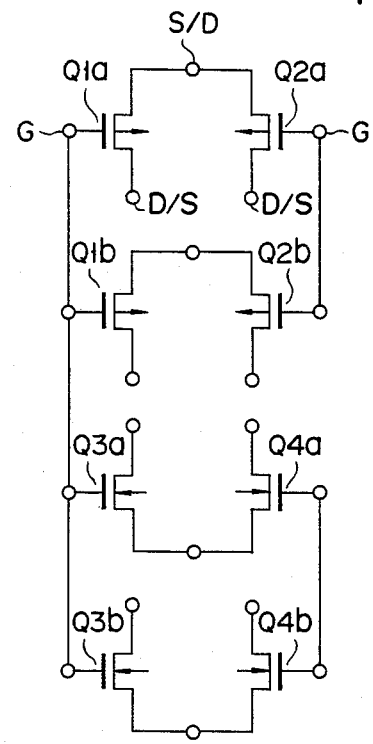
FIG. 8 shows a circuit diagram of a semiconductor device which is an embodiment of the present invention.
Figure 9:
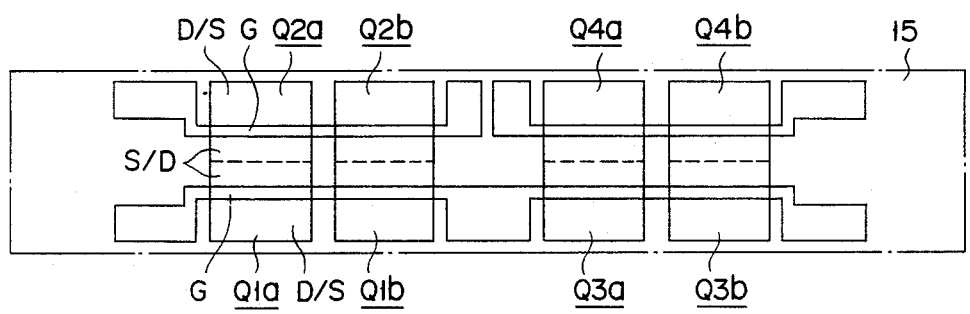
FIG. 9 shows a pattern of the basic cell shown in FIG. 8.

Reference is made to FIGS. 8 and 9 which schematically and structurally illustrate a semiconductor integrated circuit device which is an embodiment of the present invention. In FIG. 9, a couple of P channel MOSFETs Q1a and Q2a are oppositely arranged on a semiconductor wafer 15, while being connected in series. Similarly, another couple of P channel MOSFETs Q1b and Q2b are oppositely disposed on the wafer 15, while being connected in series. Further, a couple of the MOSFETs Q1a and Q2a, and Q1b and Q2b are also oppositely arranged vertically as viewed in the drawing. The physical arrangement and the electrical connection of the transistors, as mentioned above, are correspondingly applied for couples of MOSFETs Q3a and Q4a, and Q3b and Q4b. A group of the P channel MOSFETs Q1a, Q2a, Q1b and Q2b and another group of the N channel MOSFETs Q3a, Q4a, Q3b and Q4b are disposed oppositely with each other. The MOSFETs Q1a and Q1b, and Q3a and Q3b are connected together at the gate electrodes. The gate electrodes of the MOSFETs Q2a and Q2b are interconnected. The gate electrodes of the MOSFETs Q4a and Q4b are also interconnected. The size of each MOSFET, i.e., an area on a chip, is ½ that of the conventional one.

Figure 1:
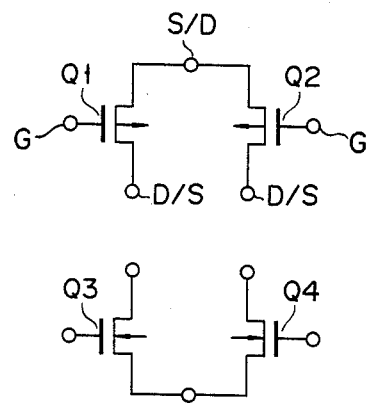
FIG. 1 shows a circuit diagram of a basic cell in a conventional semiconductor device to which the master slice system is applied.
Figure 2:
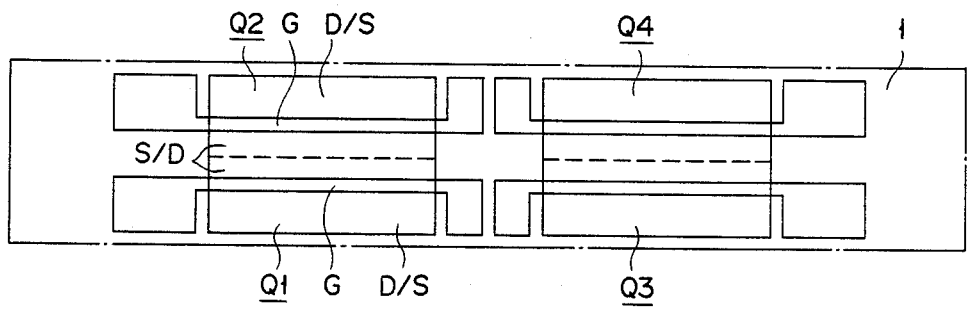
FIG. 2 shows a pattern of the basic cell of FIG. 1.

In the arrangement as mentioned above, the MOSFETs Q1a and Q1b, Q2a and Q2b, Q3a and Q3b, and Q4a and Q4b are each paired. When a pair of MOSFETs, which are interconnected at the gate electrodes, are used for the single MOSFET in the conventional device as shown in FIGS. 1 and 2, the drive ability attained is equal to that of the single MOSFET in the conventional device. In practical use, if there is no need of a large drive ability, only one of the paired MOSFETs is driven. In this case, the other MOSFET is used for another purpose.

The arrangement of the MOSFETs thus arranged provides the basic cell with a high drive ability, i.e., "gm", and with a high packing density.

Figure 3:
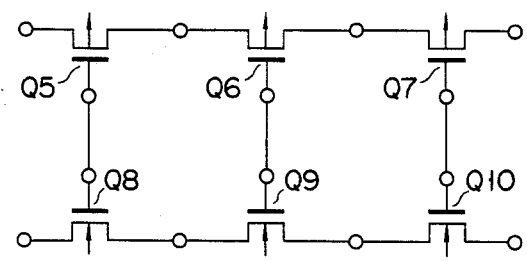
FIG. 3 shows a circuit diagram of another conventional basic cell.
Figure 4:
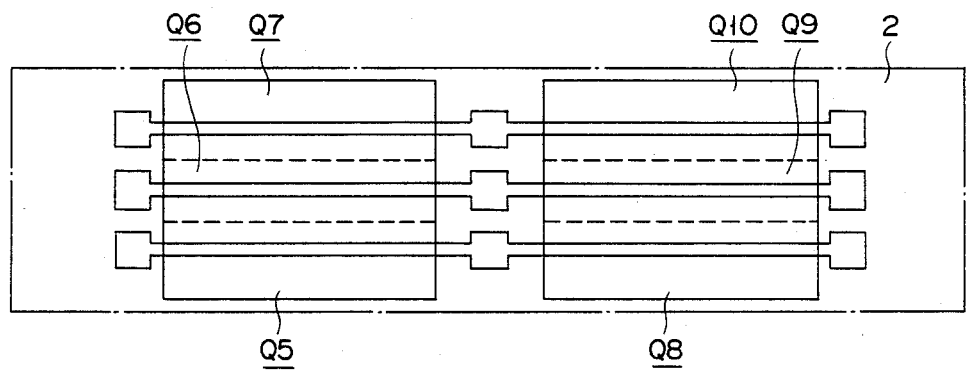
FIG. 4 shows a pattern of the basic cell of FIG. 3.
Figure 10:
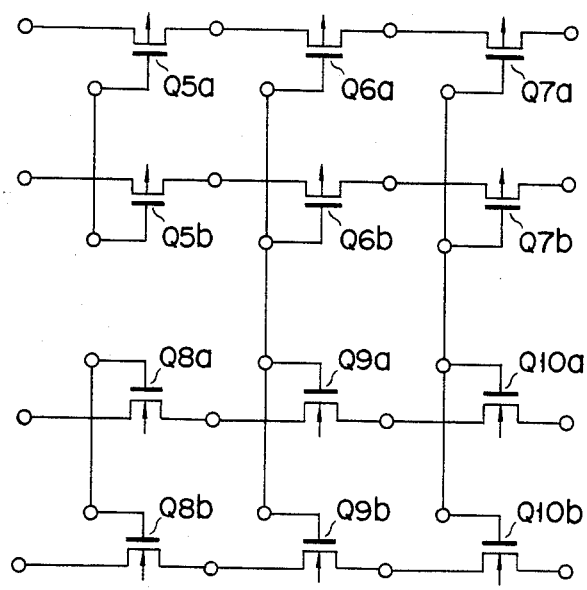
FIG. 10 shows a circuit diagram of a basic cell in a semiconductor device which is another embodiment of the present invention.
Figure 11:
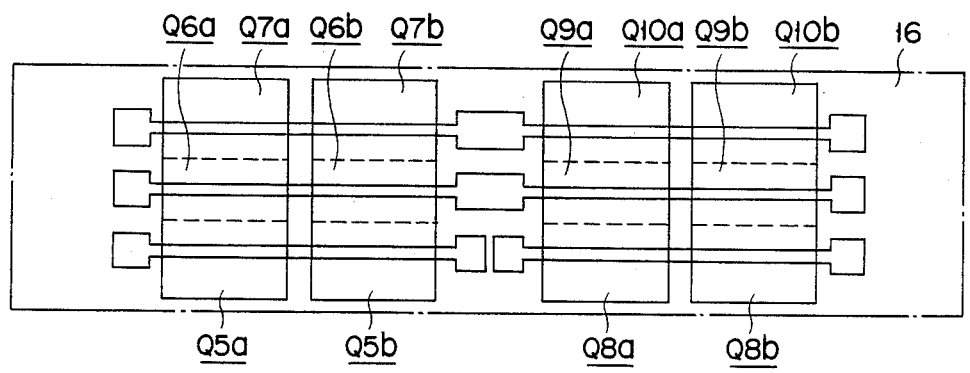
FIG. 11 shows a pattern of the basic cell shown in FIG. 10.

Referring to FIGS. 10 and 11, there is shown another embodiment of the present invention. As shown, MOSFETs Q5a–Q7a series connected and MOSFETs series connected Q5b–Q7b are structurally arranged in opposition on a semiconductor wafer 16. The MOSFETs Q5a and Q5b, Q6a and Q6b, and Q7a and Q7b are respectively interconnected at the gate electrodes. The series connected MOSFETs Q8a, Q9a and Q10a and the series connected MOSFETs Q8b, Q9b and Q10b are also arranged in opposition to each other. The MOSFETs Q8a and Q8b, Q9a and Q9b, and Q10a and Q10b are interconnected at the electrodes, respectively. A group of the MOSFETs Q5a–Q7a and Q5b–Q7b and another group of the MOSFETs Q8a–Q10a and Q8b–Q10b are disposed in opposition on the wafer 16. The common gate of the MOSFETs Q6a and Q6b is interconnected with that of Q9a and Q9b. The common gate of the MOSFETs Q7a and Q7b is likewise connected to that of the MOSFETs Q10a and Q10b. The size of each MOSFET is ½ that of the conventional device shown in FIGS. 3 and 4. The MOSFETs Q5a and Q5b, Q6a and Q6b, and Q7a and Q7b are paired, respectively.

The present embodiment also provides a semiconductor integrated circuit device with a high drive ability and a high packing density.

Figure 5:
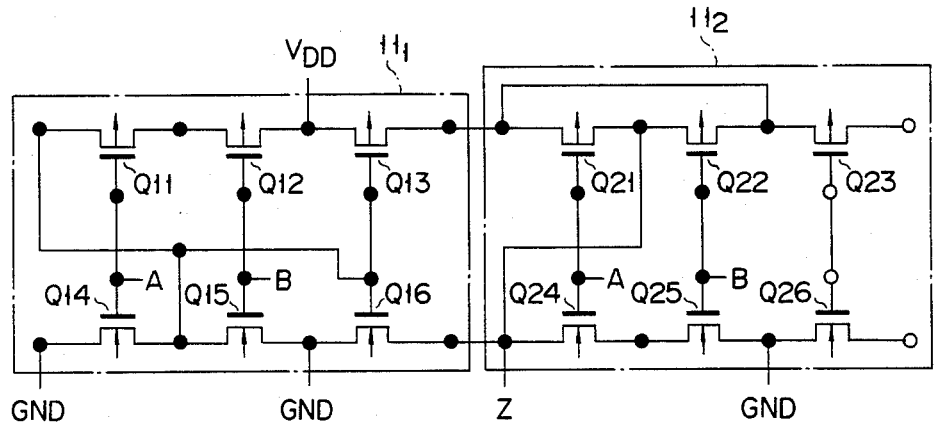
FIG. 5 shows a circuit diagram of an exclusive OR gate constructed using the basic cells as shown in FIGS. 3 and 4.
Figure 6:
FIGS. 6 and 7 show a symbolic representation of the exclusive OR gate, and a circuit arrangement of the exclusive OR gate as a combination of some different logic gates.
Figure 7:
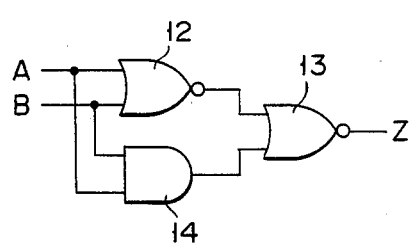
Figure 12:
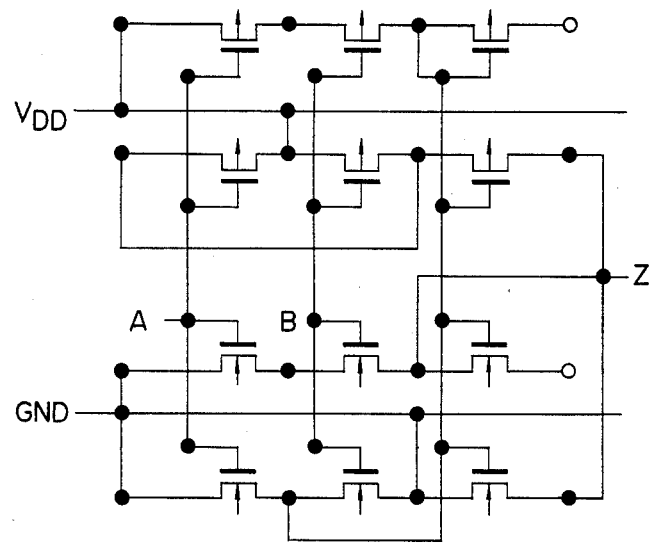
FIG. 12 is a circuit diagram of an exclusive OR gate constructed using the basic cells as shown in FIGS. 10 and 11.

FIG. 12 shows a circuit diagram of the exclusive OR gate shown in FIG. 6 when it is constructed using the basic cells as shown in FIGS. 10 and 11. In the figure, white circles indicate contact portions required for forming a final logic circuit as a semiconductor device, respectively. Black circles show contact portions required for forming the FIG. 6 circuit. The exclusive OR gate is constructed with the single basic cell shown in FIGS. 10 and 11. This indicates that the number of the cells required for the exclusive OR gate formation is ½ that of the conventional device (FIG. 5) constructed using the conventional basic cells. This arrangement provides an effective use of logic elements. As seen from the figure, while the conventional device needs four terminals for the signals A and B, the present invention requires only one terminal. This improves an efficiency of a manufacturing process of the semiconductor devices.

Figure 13:
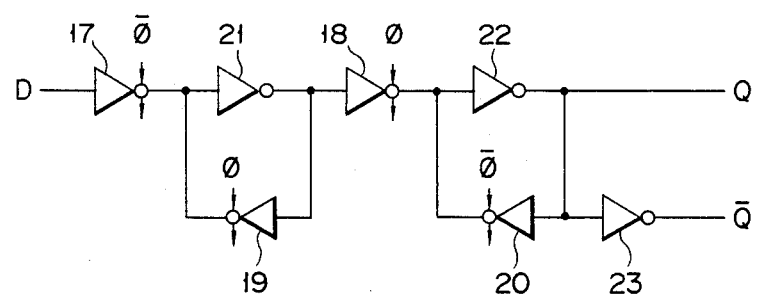
FIG. 13 shows a logic block diagram of a static shift register using clocked CMOS ($C^2MOS$) gates.
Figure 15:
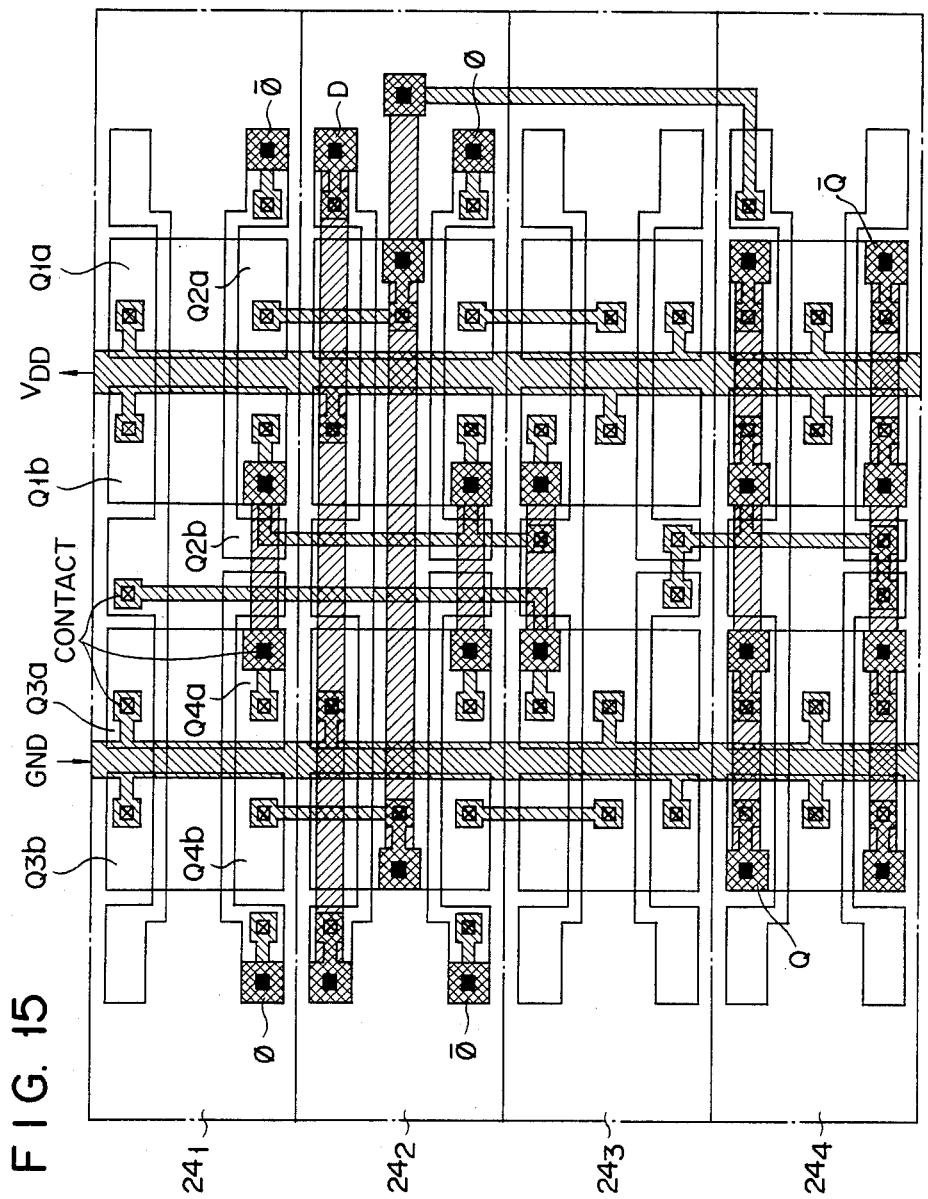
FIG. 15 shows a pattern of the shift register of FIG. 14.

FIG. 13 shows a logic circuit of a static shift register constructed using clocked MOS ($C^2MOS$) gates. The register is made up of four clocked inverters 17, 18, 19, and 20, and three inverters 21-23. FIG. 14 shows a circuit diagram of the FIG. 13 circuit when it is constructed using the basic cells. FIG. 15 shows a pattern of the FIG. 14 circuit. In FIGS. 13 and 14, D designates data, Q and $\overline{Q}$ output signals, $\phi$ and $\overline{\phi}$ clock signals. $V_{DD}$ designates a power potential and GND ground potential. As shown, four basic cells $24_1$ to $24_4$ are used for forming the static shift register. In the output stage denoted as $24_4$, a couple of transistors Q2a and Q2b are connected in parallel to have a large mutual conductance gm. Therefore, if the wiring capacity is increased, a margin enough for compensating the increase can be obtained. Additionally, in the other portions than the output stage, a couple of MOSFETs are used individually, thus resulting in high packing density.

In FIG. 15, "X" points represent contacts between a drain electrode and a drain region or between a source electrode and a source region. Black squares represent contacts between an upper layer of aluminum interconnection (rightwardly hatched) and a lower layer of aluminum interconnection (leftwardly hatched). The superposed hatched areas show the portions containing the upper and the lower interconnection layers.

It should be understood that the present invention may be variously changed and modified within the scope of appended claims. For example, the basic cells shown in FIGS. 8 and 9 and the basic cells shown in FIGS. 10 and 11 may be used in a mixed manner in a single device. Further, the basic cells shown in FIGS. 1 and 2, or FIGS. 3 and 4, and in FIGS. 8 and 9, and those in FIGS. 10 and 11 may be arrayed in a mixed manner on the same device.

As seen from the foregoing description, the semiconductor integrated circuit device, according to the present invention, has an improved packing density, and a mutual conductance (gm) as may properly be set.

What is claimed is:

1. A semiconductor integrated circuit device having gate array structure comprising a plurality of basic cells arranged in a predetermined pattern, each of the basic cells comprising first, second, third and fourth MOSFET series paths, wherein each of the first and second MOSFET series paths comprises a plurality of MOSFET channels of a first channel type connected in series;

each of the third and fourth MOSFET series paths comprises a plurality of MOSFET channels of a second channel type connected in series;

a gate of each of the MOSFETs of the first MOSFET series path is connected to the gate of a corresponding one of the MOSFETs of the second MOSFET series path; and a gate of each of the MOSFETs of the third MOSFET series path is connected to the gate of a corresponding one of the MOSFETs of the fourth MOSFET series path.

2. A semiconductor integrated circuit device according to claim 1, wherein:

the number of said MOSFETs constituting each of the first, second, third and fourth MOSFET series paths, is two, and said first channel type is an N channel type and said second channel type is a P channel type.

3. A semiconductor integrated circuit device according to claim 1, wherein:

the number of said MOSFETs constituting each of the first, second, third and fourth MOSFET series paths, is three; and said first channel type is an N channel type and said second channel type is a P channel type.

* * * * *